United States Patent [19]

Bernard

[11] Patent Number: 4,599,575
[45] Date of Patent: Jul. 8, 1986

[54] BROAD-BAND DIFFERENTIAL AMPLIFIER WITH DOUBLE REVERSE FEED-BACK OF COMMON MODE

[75] Inventor: Patrick Bernard, Grenoble, France

[73] Assignee: Societe pour l'Etude et la Fabrication de Circuits Integres Speciaux Efcis, Grenoble, France

[21] Appl. No.: 719,455

[22] Filed: Apr. 3, 1985

[30] Foreign Application Priority Data

Apr. 6, 1984 [FR] France ................. 84 05483

[51] Int. Cl.[4] ........................... H03F 3/45; H03F 3/16
[52] U.S. Cl. .................................. 330/258; 330/253; 330/277
[58] Field of Search ............... 330/253, 255, 258, 259, 330/264, 277, 290

[56] References Cited

U.S. PATENT DOCUMENTS 4,284,959  8/1981  Heagerty et al. .............. 330/253
4,371,843  2/1983  Fang et al. .................... 330/253

FOREIGN PATENT DOCUMENTS 2318534  2/1977  France .
2535546  5/1984  France .

OTHER PUBLICATIONS

IEEE International Solid-State Circuits Conference, vol. 25, fevrier 1982, New York (U.S.), R. C. Yen et al.: "An MOS Switched Capacitor Sampling Differential Instrumentation Amplifier", pp. 82, 83, 298 (p. 83, FIG. 3).

Primary Examiner—Eugene R. Laroche
Assistant Examiner—Steven J. Mottolo
Attorney, Agent, or Firm—Oblon, Fisher, Spivak, McClelland & Maier

[57] ABSTRACT

In order to diminish the risk of oscillation of a broadband amplifier 20 MHz without considerably reducing the product gain x bandwidth, this amplifier comprises a differential stage T1, T2, T3, T4, a follower stage T5, T6, two common mode feed-back braches T8, T9, T5 on the one hand, T11, T12, T10, on the other hand, and compensation capacitors C1, C2 that are unbalanced, C2 higher than C1, between the supply terminal B and each of the outputs S1, S2 of the differential stage.

3 Claims, 2 Drawing Figures

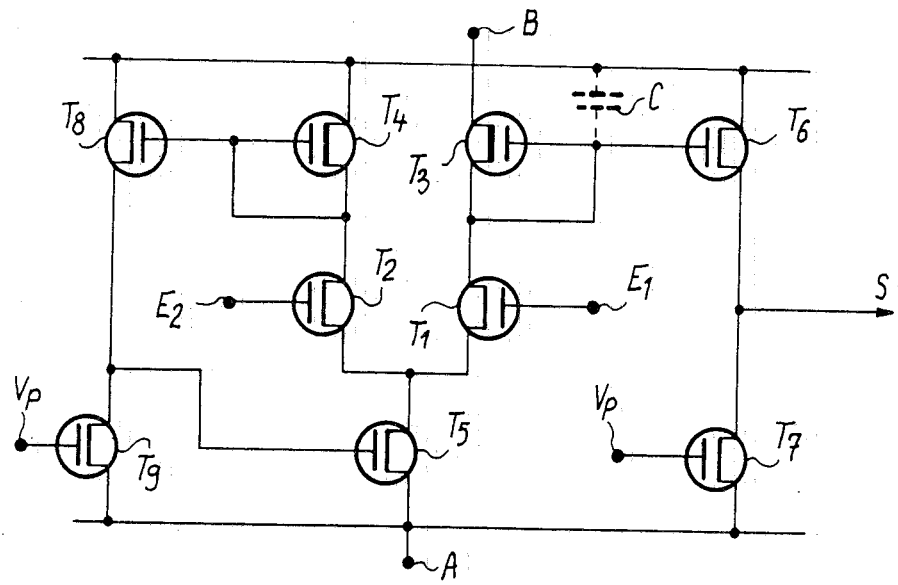
FIG_1 PRIOR ART
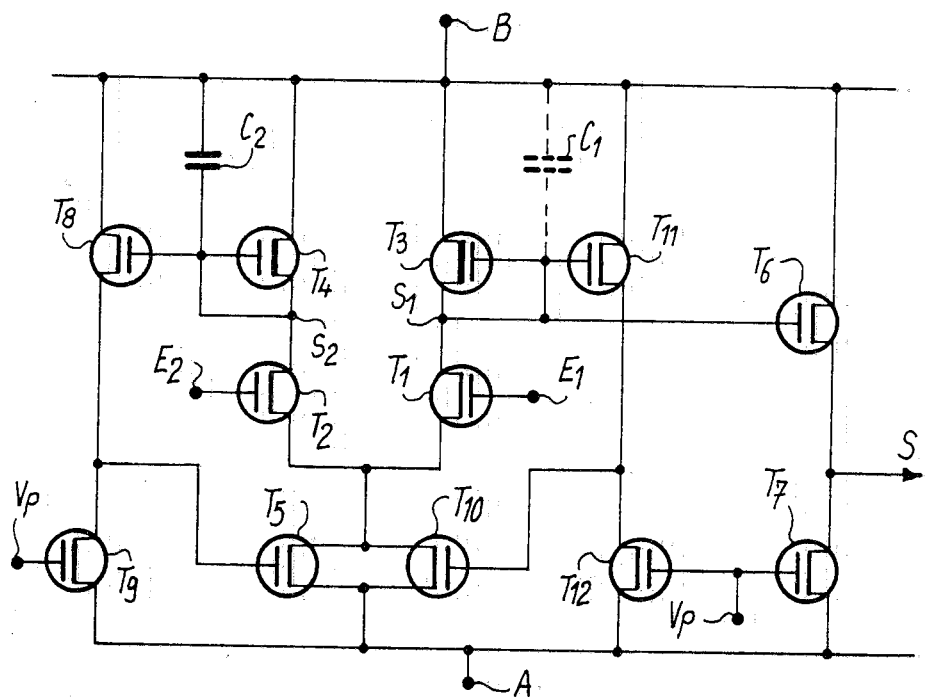
FIG_2

BROAD-BAND DIFFERENTIAL AMPLIFIER WITH DOUBLE REVERSE FEED-BACK OF COMMON MODE

BACKGROUND OF THE INVENTION

1. Field of the Invention

The present invention concerns broad-band differential amplifiers, adapted, for example, to operating up to frequencies of about 20 megahertz.

2. Discussion of the Background

A known type of amplifier is represented in FIG. 1; it comprises a differential stage for the obtention of a desired gain and a voltage follower stage, of unitary gain, for impedance matching with respect to the load that will be connected to the output. Furthermore, the amplifier comprises a common mode feed-back branch through which is reinjected in a certain way in the differential stage a signal representing the amplitude of the signal present on one of the outputs of the differential stage.

More specifically, in the diagram of FIG. 1, the differential stage comprises a common bias branch supplying two differential branches with current; the differential branches each comprise an input MOS-transistor (T1 for the first branch, T2 for the second) in series with a load-MOS-transistor (T3, T4 respectively) having its gate connected to its source if it is a transistor of the depletion type (negative voltage threshold) or its gate connected to its drain if it is a transistor of the enhancement type (positive voltage threshold); in the present description, T3 and T4 are depletion transistors; inputs E1 and E2 of the differential stage are gates of transistors T1 and T2; outputs S1 and S2 are respectively the junction point of transistors T1 and T3 of the first branch and the junction point of transistors T2 and T4 of the second branch.

The common bias branch is constituted by a MOS-transistor T5 connected between a first supply terminal A of the circuit and the combined sources of the input transistors T1 and T2.

The differential branches are connected by the drains to load-transistors T3 and T4 to a second supply terminal B.

The impedance matching follower stage comprises two MOS-transistors T6 and T7 in series between the terminals A and B, transistor T7 connected to terminal A, receiving on its gate the first output S1 of the differential stage. Output S of the amplifier is taken at the junction point of the drain of transistor T7 and of the source of transistor T6.

The common mode feed-back branch, which acts to stabilize the output levels on terminals S1 and S2 by modifying the current in the common bias branch, comprises two transistors T8 and T9 assembled as a follower stage between the second output S2 of the differential stage and the control gate of transistor T5 of the common branch; transistor T8 has its drain connected to terminal B, its gate to point S2, its source to the drain of transistor T9 and to the gate of transistor T5; transistor T9 has its source connected to terminal A and its gate supplied by a bias voltage that can be the same (Vp) as that of transistor T7.

In other lay-outs of amplifiers it is known that it is also possible to provide a double common mode feed-back by positioning another transistor in parallel on transistor T5, this other transistor having its gate controlled by output S1 through a voltage follower.

Furthermore, a basic problem in broad-band amplifiers is that of preventing oscillation at high frequencies when they are looped in unitary gain. For example, an amplifier having a gain higher than one in a bandwidth of about 20 MHz could cause a risk of oscillation at 80 MHz if its frequency response curve is such that at 80 MHz it has a gain higher than or equal to 1 while having a phase rotation of 180° at this frequency.

In order to prevent this type of oscillation, it is necessary to artificially reduce the principal cut-off frequency of the amplifier; by way of example, FIG. 1 represents the introduction of a capacitor C1 (in dashed lines) which it has been tried to position between output S1 (that which attacks the follower stage) and the second supply terminal B in order to reduce the oscillation risk.

But another difficulty arises; by introducing this capacitor there is an overall reduction of the bandwidth of the amplifier and therefore the desired specifications are not satisfied, especially with respect to the rise time of the amplifier. Thus, by wishing to suppress the oscillation risk at 80 MHz for an amplifier having a bandwidth extending up to 20 MHz, it is necessary to reduce the bandwidth to below 20 MHz, which it was not desired to do.

This problem is very general for broad-band amplifiers and cannot be overcome altogether satisfactorily with the risks of oscillation appearing being increased as both the bandwidth and the gain are raised.

Only compromises allow the set specifications to be achieved.

The present invention proposes a novel solution to overcome the risk of oscillation by maintaining the product (gain×bandwidth) as broad as possible (this product being a characteristic value for the performances of the amplifier).

According to the invention, in an amplifier such as that which has been described herein-above with reference to FIG. 1, the following are provided: on the one hand, a second common mode feed-back branch, similar to the first, between the first output S1 of the differential stage and the gate of a transistor positioned in parallel with transistor T5 of the common bias branch, and on the other hand, a capacitor between the second output S2 and the second supply terminal B, this capacitor being such that the equivalent capacitance between the second output S2 and the second supply terminal B is distinctly higher than the equivalent capacitance between the first output S1 and the second supply terminal B.

The reduction of the risk of oscillation is particularly important if the conductance of the load-transistors T3, T4 is given a value clearly lower than the conductance of the input transistors T1, T2.

The range of size of the equivalent capacitance between S2 and B can be about 3 to 6 times the equivalent capacitance between S1 and B.

BRIEF DESCRIPTION OF THE DRAWINGS

Other features, objects and advantages of the invention will become apparent from reading the following detailed description which is given with reference to the appended drawings in which:

FIG. 1 already described, represents an amplifier of the prior art;

FIG. 2 represents the amplifier according to the invention.

DETAILED DESCRIPTION OF THE PREFERRED EMBODIMENTS

In FIG. 1, the elements already described in FIG. 1 have been exactly repeated with the same references and the same connections between one another.

The difference lies in the addition of a capacitor C2 between terminal B and the second output S2 (that which is not connected to the input of the output follower stage T6, T7) and in the addition of a second common mode feed-back branch between output S1 and the common bias branch.

The common bias branch now comprises not a single transistor T5, but two transistors in parallel T5 and T10 (combined drain and combined sources), the gate of transistor T10 being connected to the junction point of two transistors T11 and T12 connected in series between terminals A and B and constituting the second common mode feed-back branch.

Transistor T11, connected to terminal B, has its gate controlled by the first output S1 (that which is connected by the follower stage to output S of the amplifier).

Transistor T12, connected to terminal A, has its gate polarized by a bias voltage that can be the voltage Vp already mentioned. Furthermore, a capacitor C1 can be connected between output S1 and terminal B, as in FIG. 1), provided however that the total C'1 of the equivalent capacitances between the points S1 and B (including C1, as well as the parasitic capacitances of transistors T3, T6, T11 especially) remains clearly lower than the total C'2 of the equivalent capacitances between points S2 and B (including C2 as well as the stray capacitances of transistors T4, T8 especially).

It can be shown, by calculations based on the simple electric modelizations of the transistors, that capacitors C1 and C2 act, on the one hand, to lower the main pole of the transfer function of the amplifier to a frequency linked to C'1+C'2, in the same way, furthermore, that capacitor C1 achieved this in the diagram of FIG. 1; but, moreover, capacitors C1 and C2 introduce a pole-zero couple where the zero is at a frequency lower than the pole when C'2 is clearly higher than C'1 since the frequency of zero is essentially linked to 1/C'2 while the frequency of the pole is linked to $\frac{1}{2}(A/C'1 + 1/C'2)$.

The phase advance introduced by this pole-zero couple, where the zero is at a lower frequency than the pole, brings about a diminution of the risk of oscillation without reducing the gain of the amplifier. The lowering of the main pole also reduces this risk by reducing the bandwidth and increasing the rise time of the amplifier, but it is possible, contrarily to the situation in the diagram of FIG. 1, to prevent excessive reduction of the bandwidth by limiting the total C'1+C'2 and by seeking to obtain the principal effect of reducing the risk of oscillation by an important unbalance of C'1 and C'2 (with C'2 higher than C'1) rather than by simply increasing the total C'1+C'2.

It could be shown that in a diagram such as that represented in FIG. 1, the introduction of another capacitor C2 between S2 and B would only act to unbalance the amplifier by introducing a pole-zero couple where the pole is at a lower frequency than the zero. Only the increase of capacitor C1 (between S1 and B) and above all no increase of capacitor C2, contributes to lowering the oscillation risk, but through a lowering of the frequency of the main pole, thus with reduction of the bandwidth and increase of the rise time of the amplifier.

This improvement proposed by the invention is particularly efficient when the conductance of input transistors T1, T2 of the differential stage is clearly higher than that of load-transistors T3, T4 and this is the reason why depletion type transistors (negative voltage threshold) have been preferably selected having their gate connected to their source.

By way of example, capacitor C1 can be of 0.3 picofarad (of the size of the stray capacitances and capacitor C2 of 1.5 picofarad, for an amplifier of establishment time of 40 nanoseconds (from 0 to 2 volts to within several millivolts), this amplifier being intended for a rapid digital-analog converter.

I claim:

1. Differential amplifier comprising a differential stage and a follower stage, the differential stage comprising a common branch connected between a first supply terminal and the junction point of two differential branches connected furthermore to a second supply terminal, the common branch comprising two transistors in parallel the gates of which are separately controlled, and each differential branch comprising an input transistor T1, T2 in series with a load transistor, the differential stage having two inputs E1, E2, respectively connected to the gates of the input transistors T1, T2 of the differential branches, and two outputs that are the junction points of the input transistors with the load transistors T3, T4 the first output S1 being connected to the input of the follower stage T6, T7 and the output of the follower stage constituting the output of the amplifier, wherein there are provided two common mode feed-back branches each constituted by a follower stage connected between a respective output S1, S2 of the differential stage and the gate of a respective transistor T5, T10 of the common branch, a capacitor C2 being connected between the second output of the differential stage and the second supply terminal B, so that that equivalent capacitance between this second output and the second supply terminal is substantially greater than the equivalent capacitance between the first output S1 and the second supply terminal B.

2. Differential amplifier according to claim 1, wherein another capacitor C1 is connected between the first output S1 of the differential stage and the second supply terminal B.

3. Differential amplifier according to one of claims 1 and 2, wherein the load transistors T3, T4 of the differential stage are depletion type transistors each having their gate connected to their source.

* * * * *